United States Patent
Huang

(10) Patent No.: US 7,684,682 B2
(45) Date of Patent: Mar. 23, 2010

(54) FAN CIRCUIT WITH A FAN SPEED CONTROL CIRCUIT

(75) Inventor: Hai-Rong Huang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 317 days.

(21) Appl. No.: 11/781,552

(22) Filed: Jul. 23, 2007

(65) Prior Publication Data

US 2008/0258664 A1    Oct. 23, 2008

(30) Foreign Application Priority Data

Apr. 20, 2007    (CN) .......................... 2007 1 0074128

(51) Int. Cl.
*G05F 1/10* (2006.01)
(52) U.S. Cl. ..................... 388/815; 388/811; 388/804; 388/806; 318/400.01; 318/400.41
(58) Field of Classification Search ................. 388/815, 388/811, 804, 806; 318/400.01, 400.41
See application file for complete search history.

(56) References Cited

U.S. PATENT DOCUMENTS

| | | | | |
|---|---|---|---|---|
| 4,455,514 A * | 6/1984 | Ohno | ..................... | 318/400.15 |
| 4,459,520 A * | 7/1984 | Wada | ..................... | 318/400.04 |
| 5,723,957 A * | 3/1998 | Ishikawa | .................. | 318/400.2 |
| 6,025,683 A * | 2/2000 | Philipp | ........................ | 318/257 |
| 6,054,819 A * | 4/2000 | Pengov | ..................... | 318/254.2 |
| 6,150,778 A * | 11/2000 | Morris | ..................... | 318/254.1 |
| 6,392,373 B1 * | 5/2002 | Glasgow et al. | ............. | 318/430 |
| 6,396,226 B2 * | 5/2002 | Schmider et al. | ....... | 318/400.26 |
| 6,982,534 B2 * | 1/2006 | Hahn et al. | ............ | 318/400.03 |
| 7,012,388 B2 * | 3/2006 | Lin et al. | ............... | 318/400.01 |
| 2006/0208675 A1 * | 9/2006 | Alberkrack et al. | ......... | 318/254 |
| 2009/0021201 A1 * | 1/2009 | Lin et al. | .................... | 318/432 |

* cited by examiner

*Primary Examiner*—Rita Leykin
(74) *Attorney, Agent, or Firm*—Frank R. Niranjan

(57) ABSTRACT

A fan speed control circuit is used for controlling rotation speed of a fan. The fan speed control circuit receives a pulse width modulation (PWM) signal from a system and comprises a programmable control unit and a current control unit. The programmable control unit receives the PWM signal, is connected to a Hall element for receiving a voltage signal therefrom, and provides a control signal. The current control unit takes the control signal to control current flowing through a stator coil unit of the fan so as to control the speed of the fan. The programmable control unit has a program written for the PWM signal, and when the fan speed control circuit is used in another system with a different PWM signal, the programmable control unit can be given a new program for the different PWM signal for controlling the speed of the fan.

9 Claims, 3 Drawing Sheets

FAN CIRCUIT WITH A FAN SPEED CONTROL CIRCUIT

BACKGROUND OF THE INVENTION

1. Field of the Invention

The present invention generally relates to a fan circuit, and more particularly to a fan circuit with a fan speed control circuit capable of being employed in different systems.

2. Description of Related Art

Nowadays, many electronic devices generate much heat during operation. Such heat can adversely affect operational stability of electronic devices. Accumulation of the heat in electronic devices can lead to high temperatures in the electronic devices, thus resulting in unstable operation and even destruction of the electronic devices. Therefore, the heat must be removed in time to keep the temperature of the electronic devices within a safe range. Fans have been used in the electronic devices for providing forced airflows to dissipate the heat. In order to effectively reduce vibrations and noises in a fan, the speed of the fan must be controlled. Among conventional fan speed control technologies, pulse width modulation (PWM) control is the most common method used to control the speed of the fan.

Referring to FIG. 3, a fan speed control circuit 70 in accordance with related art comprises a digital/analog converting unit 701 and a driving unit 702. The digital/analog converting unit 701 converts an inputted PWM digital signal 60 into an analog signal such as a voltage signal. A Hall element detects a magnetic polarity of a rotor in a fan (not shown), and gives output signal denoting magnetic pole positions of the rotor. The driving unit 702 receives the analog signal from the digital/analog converting unit 701 and the output signal of the Hall element 90. After that, a digital signal outputted from the driving unit 702 is used to control the terminal voltage of the stator coil 80 powering the fan, thus allowing the speed of the fan to be controlled.

However, characters of inputted PWM digital signals are different for different electronic devices and different systems. In conventional fan speed control circuit, the digital/analog converting unit must be changed if the fan is used in a different electronic device to receive different PWM digital signals, with other electronic elements of the fan circuit also needing to be changed. Therefore, if the fan is used in a different system, fan circuits installed with the fan speed control circuit must be redesigned, and the manufacturing cost of the fan will increase as a result.

Therefore, what is needed is a fan circuit having a fan speed control circuit capable of being employed in different systems without redesigning the fan circuit.

SUMMARY OF THE INVENTION

A fan speed control circuit is used for controlling rotation speed of a fan. The fan speed control circuit receives a pulse width modulation (PWM) signal from a system and comprises a programmable control unit and a current control unit. The programmable control unit receives the PWM signal, is connected to a Hall element for receiving a voltage signal from the Hall element, and provides a control signal. The current control unit uses the control signal to control current flowing through a stator coil unit of the fan so as to control the speed of the fan. The programmable control unit has a program written for the PWM signal, and when the fan speed control circuit is used in another system with a different PWM signal, the programmable control unit can be given a new program for the different PWM signal for controlling the speed of the fan.

Other systems, methods, and advantages of the present apparatus and method will be or become apparent to one with skill in the art upon examination of the following drawings and detailed description. It is intended that all such additional systems, methods, features, and advantages be included within this description, be within the scope of the present device, and be protected by the accompanying claims.

BRIEF DESCRIPTION OF THE DRAWINGS

Many aspects of the present apparatus and the present method can be better understood with reference to the following drawings. The components in the drawings are not necessarily drawn to scale, emphasis instead being placed upon clearly illustrating the principles of the present device. Moreover, in the drawings, like reference numerals designate corresponding parts throughout the several views.

DETAILED DESCRIPTION OF THE INVENTION

Figure 1:
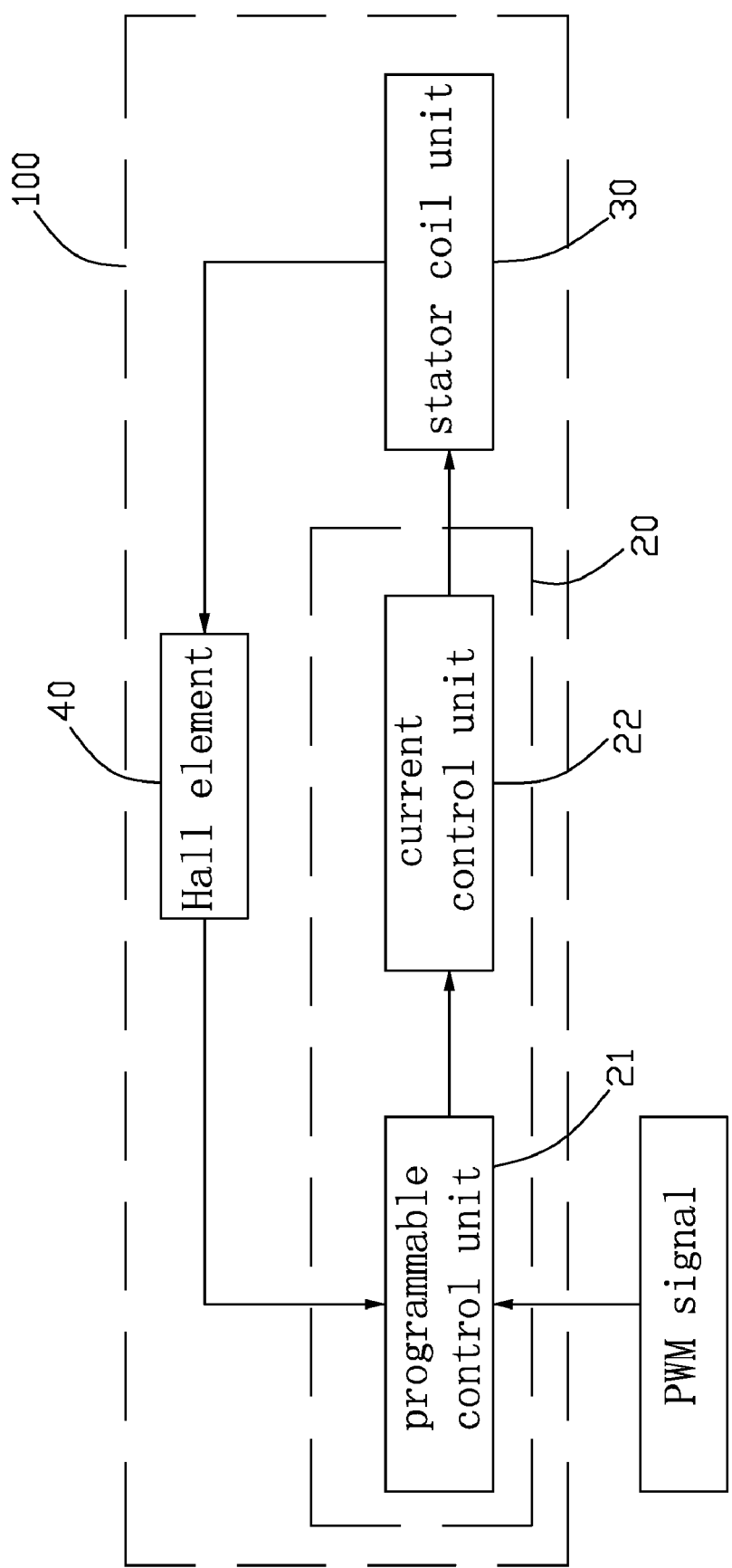
FIG. 1 is a block diagram showing the basic structure of a fan circuit in accordance with the present invention, the fan circuit including a fan speed control circuit.

Referring to FIG. 1, a fan circuit 100 in accordance with the invention comprises a fan speed control circuit 20, a stator coil unit 30 and a Hall element 40. The fan speed control circuit 20 comprises a programmable control unit 21 and a current control unit 22. The current control unit 22 is connected between the programmable control unit 21 and the stator coil unit 30. The Hall element 40 detects the magnetic polarity of the stator coil unit 30 of a fan (not shown) and creates an output signal directly proportional to the magnetic field strength.

The programmable control unit 21 is configured to receive an inputted pulse width modulation (PWM) digital signal from an electronic device (such as a central processing unit) and the output signal of the Hall element 40. The programmable control unit 21 converts the PWM digital signal and the output signal of the Hall element 40 into a control signal using a program stored in the programmable control unit 21. The current control unit 22 uses the control signal to control the current in the stator coil so as to control a rotation speed of the fan.

During operation of the electronic device, when temperature of the electronic device increases, a duty cycle of the input PWM digital signal should increase also. The PWM digital signal is high for longer periods of time. The programmable control unit 21 receives the PWM digital signal and converts the input PWM digital signal into a control digital signal for the current control unit 22. The control digital signal then increases the current in the stator coil unit 30 via the current control unit 22 making the fan speed increase.

When the temperature of the electronic device becomes lower, the duty cycle of the input PWM digital signal is also lowered and the PWM digital signal is low for longer periods of time. The programmable control unit 21 receives the PWM digital signal and converts it into a control signal and transfers the control signal to the current control unit 22. The control PWM signal reduces the current flowing through the stator coil unit 30 via the current control unit 22 and the fan speed becomes lower.

Therefore, when the temperature becomes high, the fan speed control circuit 20 drives the fan to rotate at a high speed. When the temperature becomes low, the fan speed control circuit 20 drives the fan to rotate at slow speed.

Figure 2:
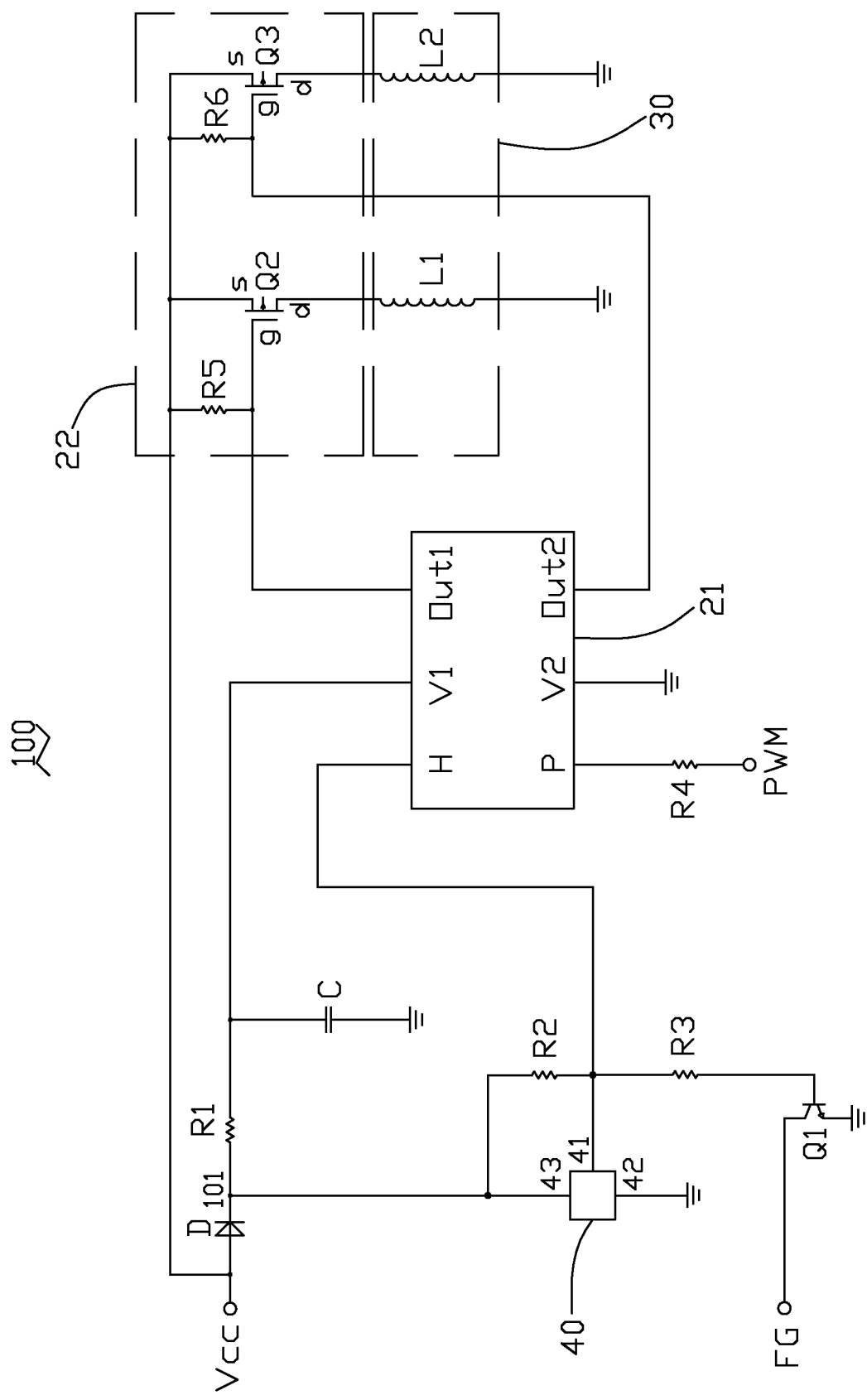
FIG. 2 is a schematic diagram showing a detailed structure of the fan circuit of FIG. 1.
Figure 3:
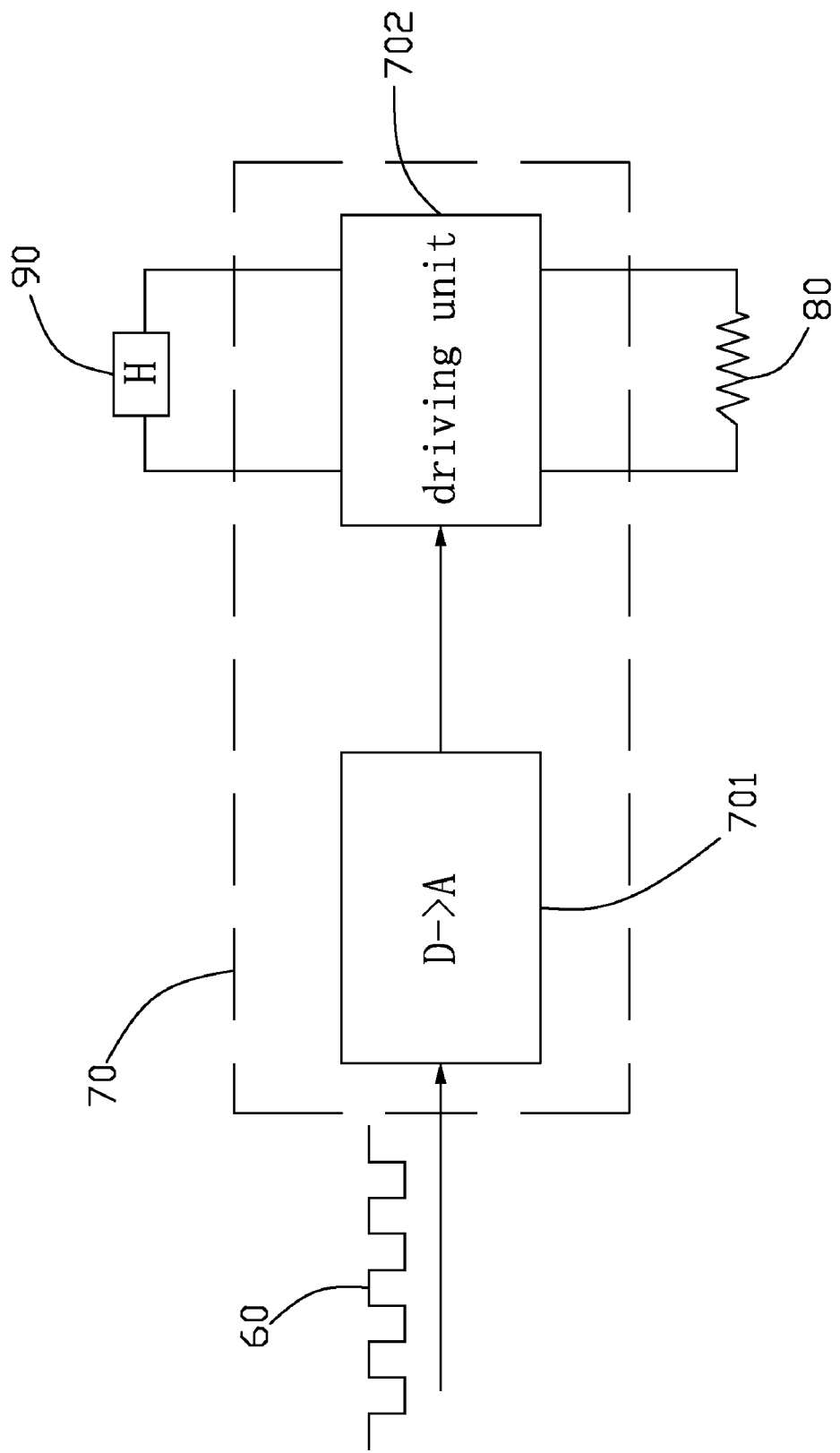
FIG. 3 is a block diagram showing a fan speed control circuit in accordance with related art.

Referring to FIG. 2, the programmable control unit 21 in accordance with the present embodiment can be a single chip processor, having a first input terminal P, a second input terminal H, a third input terminal V1, a fourth input terminal V2, a first output terminal Out1, and a second output terminal Out2. The first input terminal P is connected to a PWM input node and receives the input PWM digital signal. A resistor R4 is connected between the first input terminal P and the PWM input node. The fourth input terminal V2 is connected to a first virtual ground point. The first output terminal Out1 and the second output terminal Out2 output an alternating driving voltage driving the fan to rotate.

The current control unit 22 comprises a first MOSFET (metal oxide semiconductor field effect transistor) Q2, a second MOSFET Q3. The first and second MOSFETs Q2, Q3 are p-channel depletion MOSFETs in this embodiment. The first and second MOSFETs Q2, Q3 are used for controlling the current flowing through the stator coil unit 30. A gate of the first MOSFET Q2 is connected to the first output terminal Out1 of the programmable control unit 21. A drain of the first MOSFET Q2 is connected to the stator coil unit 30. A source of the first MOSFET Q2 is connected to a power source Vcc. A resistor R5 is connected between the gate of the first MOSFET Q2 and the source of the first MOSFET Q2. A gate of the second MOSFET Q3 is connected to the second output terminal Out2 of the programmable control unit 21. A drain of the second MOSFET Q3 is connected to the stator coil unit 30. A source of the second MOSFET Q3 is connected to the power source Vcc. A resistor R6 is connected between the gate of the second MOSFET Q3 and the source of the second MOSFET Q3.

The stator coil unit 30 comprises a first stator coil L1 and a second stator coil L2. The first stator coil L1 is connected between the drain of the first MOSFET Q1 and a second virtual ground point. The second stator coil L2 is connected between the drain of the second MOSFET Q2 and a third virtual ground point.

The Hall element 40 has three terminals 41, 42, 43. The terminal 41 is connected to the second input terminal H of the programmable control unit 21. The second terminal 42 is connected to a fourth virtual ground point. The third terminal 43 is connected to a node 101. A bipolar junction transistor (BJT) Q1 is used for amplifying a signal from the Hall element 40. A base of the BJT Q1 is connected to the terminals 41 of the Hall element 40 via a resistor R3. A collector of the BJT Q1 is connected to an output node FG. An emitter of the BJT Q1 is connected to a fifth virtual ground point.

A diode D is connected between the power source Vcc and node 101. A resistor R1 is connected between the node 101 and the third input terminal V1 of the programmable control unit 21. A capacitor C is connected between the third input terminal V1 of the programmable control unit 21 and a sixth virtual ground point.

When the fan works, the programmable control unit 21 receives an inputted PWM digital signal via the first input terminal P and receives the output signal of the Hall element 40 via the second input terminal H. The programmable control unit 21 converts the PWM digital signal into an analog signal via a program stored in the programmable control unit 21. The first output terminal Out1 and the second output terminal Out2 of the programmable control unit 21 alternately output the analog signal to respectively control the first MOSFET Q2 and the second MOSFET Q3 so as to control the current of the first stator coil L1 and the second stator coil L2, thus driving the fan to rotate continuously with variable speed.

When the fan is used in a new system, the fan circuit having the fan speed control circuit does not need to be changed, and only needs to be provided with a new program for converting a new PWM digital signal from the new system into a control signal. Therefore, elements of the fan circuit do not need to be changed when the fan is used for a new electronic device in a new system, and the designing and manufacturing cost of the fan circuit can be reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fan speed control circuit for receiving a pulse width modulation (PWM) signal from a system to control a rotation speed of a fan, comprising:

a programmable control unit receiving the PWM signal and connected to a Hall element for receiving a voltage signal from the Hall element, the Hall element detecting the rotation speed of the fan, and providing a control signal; and a current control unit taking the control signal of the programmable control unit and controlling current flowing through a stator coil unit of the fan so as to control the rotation speed of the fan;

wherein the programmable control unit has a program written for the PWM signal, and when the fan speed control circuit is used in another system with a different PWM signal, the programmable control unit can be given a new program for the different PWM signal for controlling the rotation speed of the fan;

wherein the current control unit comprises a first MOSFET and a second MOSFET; and wherein the first MOSFET and the second MOSFET are p-channel depletion MOSFETs.

2. The fan speed control circuit according to claim 1, wherein the programmable control unit has a first output terminal connecting to a gate of the first MOSFET and a second output terminal connecting to a gate of the second MOSFET.

3. The fan speed control circuit according to claim 2, wherein each of the first MOSFET and the second MOSFET has a source connected to a power source and a drain connected to the stator coil unit.

4. The fan speed control circuit according to claim 3, wherein a resistor is connected between the gate of the first MOSFET and the source of the first MOSFET.

5. The fan speed control circuit according to claim 3, wherein a resistor is connected between the gate of the second MOSFET and the source of the second MOSFET.

6. The fan speed control circuit according to claim 1, wherein the programmable control unit is a single chip processor.

7. A fan circuit for receiving a pulse width modulation (PWM) signal from a system to control rotation speed of a fan, comprising:

a stator coil unit of the fan;

a Hall element detecting the magnetic polarity of the stator coil unit and outputting a voltage signal directly proportional to the magnetic field strength of the stator coil unit;

a programmable control unit receiving the PWM signal and connected with the Hall element for receiving the voltage signal from the Hall element, and providing a control signal; and a current control unit taking the control signal of the programmable control unit and controlling current flowing through the stator coil unit of the fan so as to control the rotation speed of the fan;

wherein the programmable control unit has a program written for the PWM signal, and when the fan circuit is used in another system with a different PWM signal, the programmable control unit can be provided with a new program for the different PWM signal for controlling the rotation speed of the fan;

wherein the current control unit comprises a first MOSFET and a second MOSFET; and wherein the first MOSFET and the second MOSFET are p-channel depletion MOSFETs.

8. The fan circuit according to claim 7, wherein the programmable control unit has a first output terminal connecting to a gate of the first MOSFET and a second output terminal connecting to a gate of the second MOSFET.

9. The fan circuit according to claim 7, wherein the programmable control unit is a single chip processor.

* * * * *